United States Patent
Yoo

(10) Patent No.: US 8,138,572 B2
(45) Date of Patent: Mar. 20, 2012

(54) SEMICONDUCTOR DEVICE AND METHOD FOR FABRICATING THE SAME

(75) Inventor: Keon Yoo, Icheon-si (KR)

(73) Assignee: Hynix Semiconductor Inc, Icheon (KR)

( * ) Notice: Subject to any disclaimer, the term of this patent is extended or adjusted under 35 U.S.C. 154(b) by 301 days.

(21) Appl. No.: 12/640,354

(22) Filed: Dec. 17, 2009

(65) Prior Publication Data

US 2010/0181646 A1 Jul. 22, 2010

(30) Foreign Application Priority Data

Jan. 22, 2009 (KR) ........................ 10-2009-0005641

(51) Int. Cl.
*H01L 21/02* (2006.01)

(52) U.S. Cl. ................. 257/532; 257/296; 257/E29.112; 257/E29.342; 257/E21.011; 257/E21.646; 438/399; 438/396; 438/397; 438/256; 977/932; 977/943

(58) Field of Classification Search .................. 257/532, 257/296, E29.112, E29.342, E21.011, E21.646; 438/399, 396, 397, 256; 977/932, 943
See application file for complete search history.

(56) References Cited

U.S. PATENT DOCUMENTS 7,336,523 B2 * 2/2008 Kang ........................... 365/151

FOREIGN PATENT DOCUMENTS

| JP | 2004-146520 A | 5/2004 |
| KR | 1020060023064 A | 3/2006 |
| KR | 1020070015253 A | 2/2007 |

* cited by examiner

*Primary Examiner* — Tu-Tu Ho

(57) ABSTRACT

The present invention relates to a semiconductor and manufacturing method thereof, in which a nano tube structure is vertically grown to form a lower electrode of a cell region and a via contact of peripheral circuit region. Therefore, capacitance of the lower electrode is secured without an etching process for high aspect ratio. Also, the via contact can be formed for corresponding to the height of the lower electrode.

16 Claims, 5 Drawing Sheets

SEMICONDUCTOR DEVICE AND METHOD FOR FABRICATING THE SAME

CROSS-REFERENCE TO RELATED APPLICATION

The present application claims priority to Korean patent application No. 10-2009-0005641, filed on 22 Jan. 2009, which is incorporated by reference in its entirety.

BACKGROUND OF THE INVENTION

The present invention relates to a semiconductor device and a manufacturing method thereof. More particularly, the present invention relates to a method for forming a capacitor.

Generally, a capacitor includes conductive materials capable of supplying current, which are separated from each other with a given space. In addition, a dielectric material with a specific dielectric constant is placed between the conductive materials. Capacitance of a capacitor is proportional to an effective area of the capacitor and a dielectric constant of a dielectric material, and is inversely proportional to a distance between the conductive materials.

With increasing integration in semiconductor memory devices, there have been developed technologies that increase capacitance of the capacitor in order to compensate for reducing the two-dimensional size of storage nodes. First, for example, there is a technology that increases vertical area of a capacitor. According to the technology, an oxide film formed in a capacitor with a stacking method can be made thicker, and in a trench method, an effective area of the capacitor can be increased by more deeply etching a silicon substrate.

Second, there is a technology that reduces a thickness of a dielectric film used in a capacitor or deposits dielectric film with a high dielectric constant. For example, elements with heavy atomic weight such as Hf, Zr, Ta or St are used solely or in combinations thereof to form the dielectric film with high dielectric constant (high-k) materials, or the atomic layer deposition (ALD) method is used to form the dielectric film with thickness of a few angstroms.

Third, there is a technology that changes a structure of a capacitor to increase its effective area. The effective area of the capacitor can be increased by growing metastable-polysilicon (MSP) on a surface of the capacitor to form an uneven surface, after the capacitor is patterned, or by performing selective chemical etching on an oxide film where the capacitor pattern is formed.

Among the above described technologies of forming the capacitor, when thin high-k materials are deposited to form the dielectric film, a leakage current may be generated through the dielectric film. This leakage current leads to the loss of charge stored in a storage node, which may result in the loss of stored information.

Meanwhile, for electrically connecting between a wiring layer (i.e., a bit line) under the storage node, and a metal wiring layer formed over the storage node in a DRAM memory device, a deep contact hole is formed and filled with a conductive material to form a via contact.

In that case, as aspect ratios of the storage node and the via contact hole increase, it the process difficulty increases, and the defective rate also increases in the course of the process.

In addition, when the etching process is performed in order to form a contact hole having a large aspect ratio, there can be a difference between the upper diameter of the contact hole and the lower diameter thereof. If the difference between the upper and lower diameters is large, the via contact hole may not be completely etched down to the bottom, thereby causing a so-called "hole-not-open" phenomenon. Also, a process difficulty increases for filling the storage node and the contact hole with the conductive materials.

BRIEF SUMMARY OF THE INVENTION

The present invention improves a method of forming a lower electrode in a cell region and a via contact in a peripheral region to simplify manufacturing processes and improve characteristics of a semiconductor device.

In accordance with the present invention, a method of fabricating a semiconductor device comprises: forming a first metal layer on a surface of a bit line and a bit line pad formed in a cell region and a peripheral region, respectively; forming an interlayer insulating film over the first metal layer and a substrate; etching the interlayer insulating film in the cell region, and then forming a storage node contact plug filled therein; forming a second metal layer over the storage node contact plug; etching the interlayer insulating film in the peripheral region to form a contact hole exposing the first metal layer over the bit line pad; growing a nano tube as a catalyst with the second metal layer in the cell region and the exposed first metal layer in the peripheral region, to form a lower electrode and a first contact, respectively; and forming a second contact connected to the first contact in the peripheral region to form a via contact.

The method further comprises forming a dielectric film over a surface of the interlayer insulating film and the lower electrode; and forming an upper layer on a surface of the dielectric film. The first metal layer and the second metal layer includes one selected from the group consisting of Ni, Co, Fe, La, Ti, Y, Pd, Pt and combinations thereof.

In addition, the top of the storage node contact plug is disposed lower than the top of the interlayer insulating film to form a height difference between the storage node contact plug and the interlayer insulating film. The step of forming the second metal layer further comprises forming a metal catalyst material over the storage node contact plug and the interlayer insulating film; and polishing the metal catalyst material until exposing the interlayer insulating film to fill the height difference with the metal catalyst material.

Also, the nano tube is grown by performing a CVD process, and is preferably a Carbon nano tube, a Si nano tube or a Ge nano tube. The carbon nano tube is grown by using $CH_4$, $C_2H_2$, ethanol or CO gas at a temperature of 300~900° C. The Si nano tube is grown by using a gas containing $SiH_4$ or $Si_2H_6$ at a temperature of 300~900° C. The Ge nano tube is grown by using Ge containing gas at a temperature of 300~900° C. In addition, the method further comprises forming a dielectric film and an upper electrode over the lower electrode and the interlayer insulating film. Also, the method further comprises forming a metal wiring connected to the second contact.

In accordance with the present invention, a semiconductor device comprises a bit line and a storage node contact formed in a cell region; a bit line pad formed in a peripheral region; a lower electrode formed to be connected to the storage node contact; and a first contact formed to be connected to the bit line pad, wherein the lower electrode and the first contact include a nano tube structure.

The nano tube is preferably a Carbon nano tube, a Si nano tube or a Ge nano tube. The semiconductor device further comprises a dielectric film and an upper electrode over the lower electrode. In addition, the semiconductor device further comprises a second contact connecting with the first contact.

DESCRIPTION OF EMBODIMENT

Reference will now be made to the drawings, which describe embodiments of the invention in detail.

FIGS. 1a through 1d illustrate a method for forming a capacitor of a semiconductor device according to the present invention.

Figure 1A:
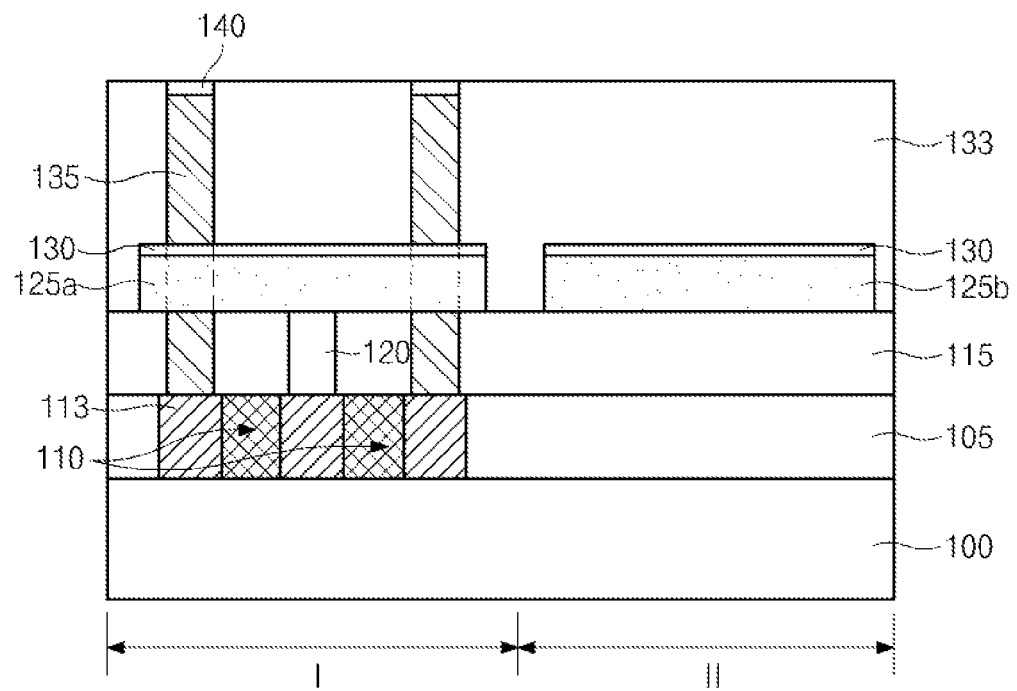
FIGS. 1a through 1d illustrate a method for forming a capacitor of a semiconductor device according to the present invention.

Referring to FIG. 1a, a gate electrode 110 is formed over a semiconductor substrate 100 in a cell region and a peripheral region II. At this time, the gate electrode 110 is formed only over the cell region I.

Next, a first interlayer insulating film 105 is formed over the gate electrode 110 and the semiconductor substrate 100. In addition, the first interlayer insulating film 105 is etched to form a landing plug contact hole exposing the semiconductor substrate 100. Now, the landing plug contact holes are formed on both sides of the gate electrode 110. Also, the landing plug contact hole is filled with a polysilicon layer to form a landing plug contact 113.

Thereafter, a second interlayer insulating film 115 is formed over the gate electrode 110, landing plug contact 113, and the semiconductor substrate 100.

Next, a second interlayer insulating film 115 in a bit line region to be formed is selectively etched and filled with a conductive material to form a bit line contact 120 connected to the landing plug contact 113. In addition, a bit line 125a connected to the bit line contact 120 is formed over the second interlayer insulating film 115. Now, a bit line pad 125b is formed in the peripheral region II.

Then, a first metal layer 130 is formed over the bit line 125a and the bit line pad 125b. Now, the first metal layer 130 acts as a catalyst layer for growing a nano tube structure and includes one selected from the group consisting of Ni, Co, Fe, La, Ti, Y, Pd, Pt and combinations thereof.

Next, a third interlayer insulating film 133 is formed over the first metal layer 130 and the second interlayer insulating film 115. Then, the third interlayer insulating film 133 and the second interlayer insulating film 115 of a storage node contact region to be formed in the cell region I is selectively etched to form a storage node contact hole (not shown) exposing the landing plug contact 113.

Thereafter, the storage node contact hole (not shown) is filled with a conductive material to form a storage node contact plug 135. Here, the conductive material is not completely filled up to the top of the storage node contact hole (not shown). As a result, a height difference is formed between the third interlayer insulating film 133 and the storage node contact plug 135.

Next, a second metal layer 140 is formed over the storage node contact plug 135 and the third interlayer insulating film 133. The second metal layer 140 is then polished until the third interlayer insulating film 133 is exposed, to fill the height difference over the storage node contact plug 135. That is, the second metal layer 140 is left only over the top of the storage node contact plug 135. Here, a polishing method can be a chemical mechanical polishing (CMP) or an etch-back process.

Now, the second metal layer 140 serves as a catalyst layer for use in growing nano tube as the same as the first metal layer 130. For example, the second metal layer 140 is made of a material including one selected from the group consisting of Ni, Co, Fe, La, Ti, Y, Pd, Pt and combinations thereof.

Figure 1B:
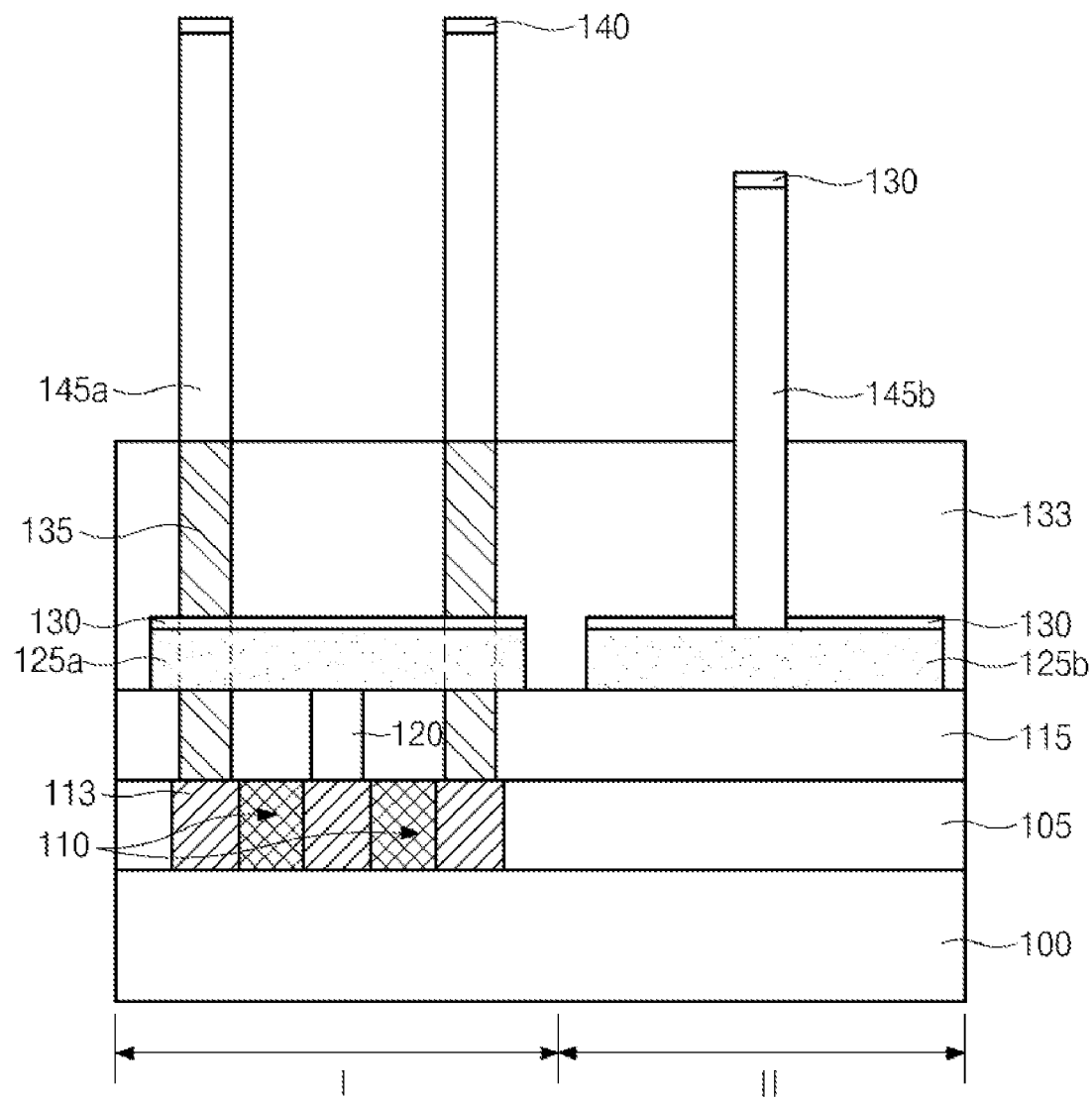

Referring to FIG. 1b, the third interlayer insulating film 133 in the peripheral region II is partially etched to form a first contact hole (not shown). Now, the first contact hole (not shown) exposes a portion of the first metal layer 130 over the bit line pad 125b.

Next, the second metal layer 140 formed over storage node contact plug 135 in the cell region I and the first metal layer 130 exposed by the first contact hole (not shown) in the peripheral region II are used as a catalyst to grow a nano tube structure. Here, a nano tube structure in the cell region I is used as a lower electrode, and a nano tube structure in the peripheral region II is used as the bit line pad 125b and a contact plug (hereinafter a first contact 145b) connected to a metal wiring layer which is subsequently formed. Now, the lower electrode 145a and the first contact 145b, which are the nano tube structure, are grown to the same height from the surfaces of the second metal layer 140 and the first metal layer 130, respectively. Therefore, a height difference between the top of the lower electrode 145a and the top of the first contact 145b may occur by a height difference between the top of the first metal layer 130 formed over the bit line pad 125b and the top of the second metal layer 140 formed over the storage node contact plug 135.

In addition, the nano tube structure reacts to a material formed under the first and second metal layers 130 and 140, so that the first and second metal layers 130 and 140 are raised along the nano tube structure. Now, the material formed under the first and second metal layers 130 and 140a including one selected from the group consisting of doped poly silicon, Ti, Ta, W, TiN, TiSiN, TiAlN, TaN, TaSiN, TaAlN, WN and combinations thereof.

Therefore, the first and second metal layers 130 and 140 are positioned over the nano tube structure. That is, the second metal layer 140 is positioned over the lower electrode 145a, and the first metal layer 130 is positioned over the first contact 145b.

Now, the nano tube structure is illustrated. First, the nano tube structure exists as a single nano tube or a bundle of nano tubes. Here, a diameter of the nano tube structure is determined through an area of an exposed metal layer.

In addition, a grown nano tube structure can be one of Carbon nano tube, Si nano tube, and Ge nano tube based on a kind of source gas and a temperature inside a reaction chamber.

For example, the Carbon nano tube is grown by using $CH_4$, $C_2H_2$, ethanol or CO gas at a temperature of 300~900° C. with a CVD process. Also, the Si nano tube is grown by using a gas containing $SiH_4$ or $Si_2H_6$ at a temperature of 300~900° C. with a CVD process.

Also, the Ge nano tube is grown by using Ge containing gas at a temperature of 300~900° C. with a CVD process.

Figure 1C:
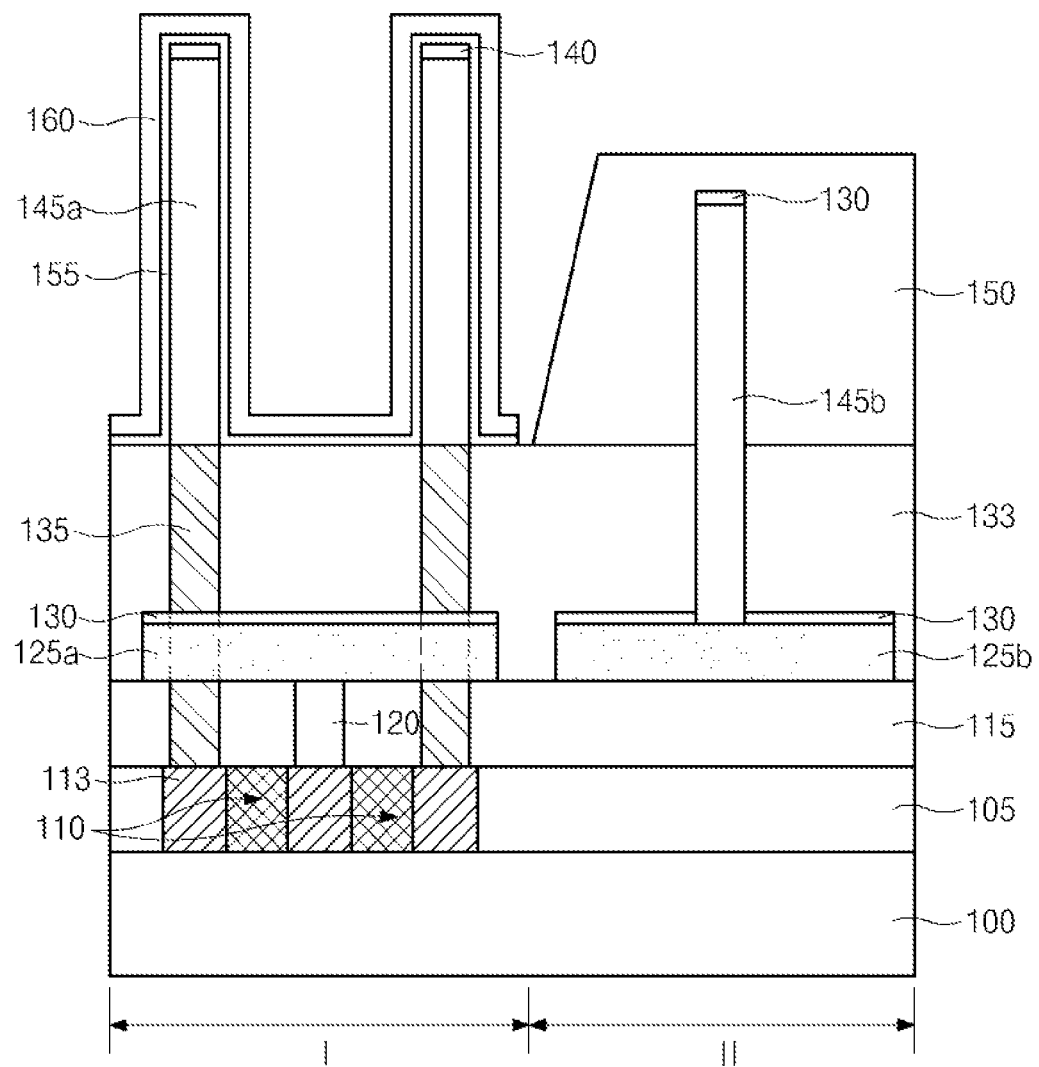

Referring to FIG. 1c, a fourth interlayer insulating film 150 is formed over the lower electrode 145a, first contact 145b, and the third interlayer insulating film 133. Now, the fourth interlayer insulating film 150 completely covers the lower electrode 145a and the first contact 145b.

Next, the fourth interlayer insulating film 150 is selectively etched to leave the fourth interlayer insulating film 150 only over the peripheral region II. Here, the first contact 145b in the peripheral region II may not be opened due to the left fourth interlayer insulating film 150.

After that, a dielectric film 155 and a conductive layer 160 used as an upper electrode are formed over surfaces of the lower electrode 145a, the third interlayer insulating film 133, and the fourth interlayer insulating film 150. Now, since the first contact 145b, that is, a nano tube structure in the peripheral region II is protected by the fourth interlayer insulating film 150, a capacitor may not be formed thereon.

Next, the dielectric film 155 and the conductive layer 160 are selectively removed from the fourth interlayer insulating film 150.

Figure 1D:
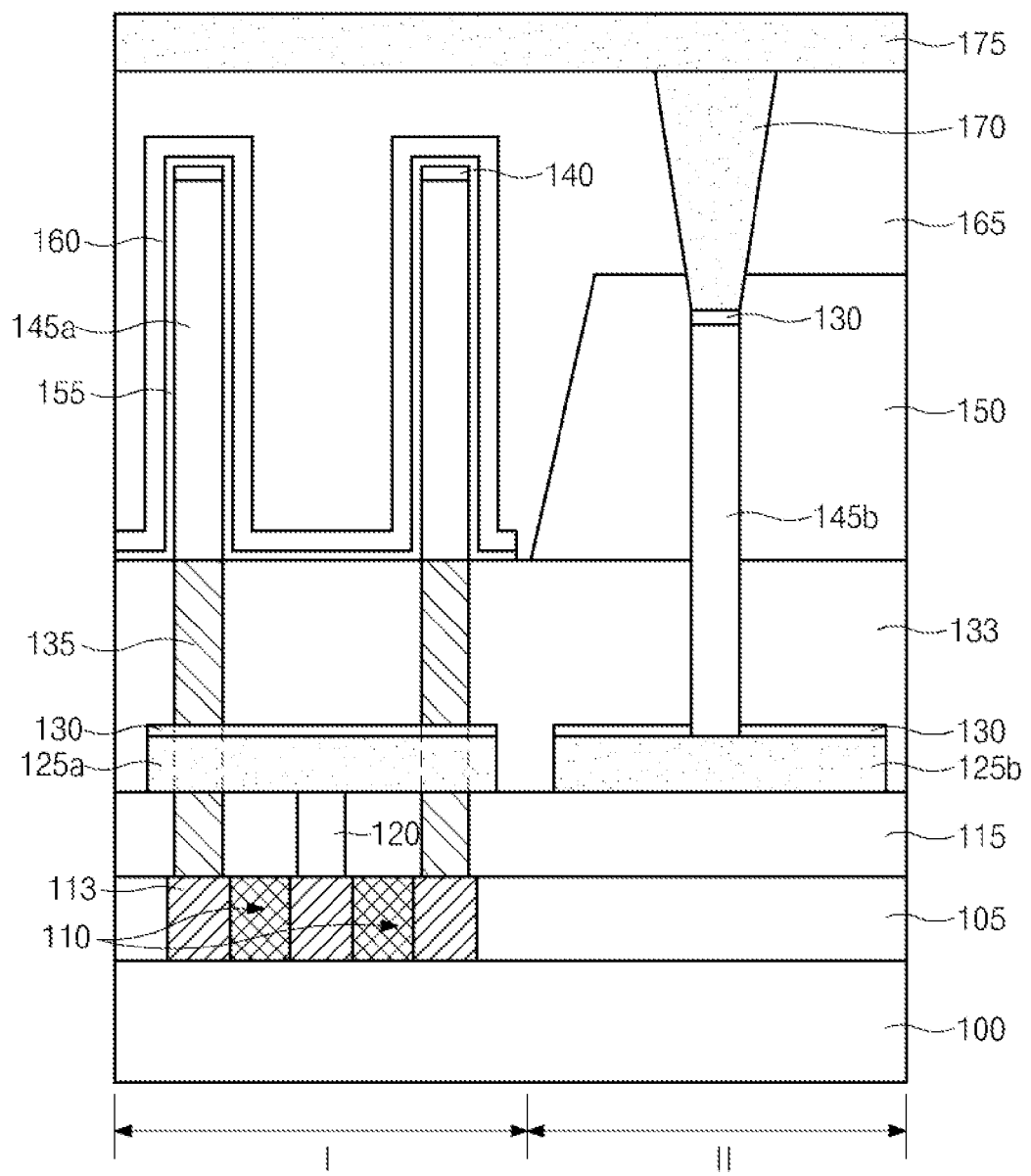

Referring to FIG. 1d, a fifth interlayer insulating film 165 is formed over the conductive layer 160 in the cell region I and the fourth interlayer insulating film 150 in the peripheral region II.

After that, the fifth interlayer insulating film 165 in the peripheral region II is etched to form a contact hole (not shown) exposing the first metal layer 130 over the first contact 145b. Here, since the prior art is etched until the bit line pad 125b is exposed, there is a problem with a high aspect ratio of the contact hole (not shown). This generates the hole-not-open phenomenon that the contact hole is not completely etched.

However, in the present invention, since the contact hole exposing the first contact 145b is etched after forming the first contact 145b having a given height in the peripheral region II by using a nano tube, an aspect ratio of the contact hole becomes lower. Therefore, the process difficulty for forming a contact hole can be simplified.

Next, the contact hole (not shown) is filled to form a second contact 170 connected to the first contact 145b.

Next, a metal wiring layer 175 connected to the second contact 170 is formed over the fifth interlayer insulating film 165. Here, the first and second contacts 145b and 170 become a via contact connecting to the bit line pad 125b and the metal wiring layer 175.

Figure 2:
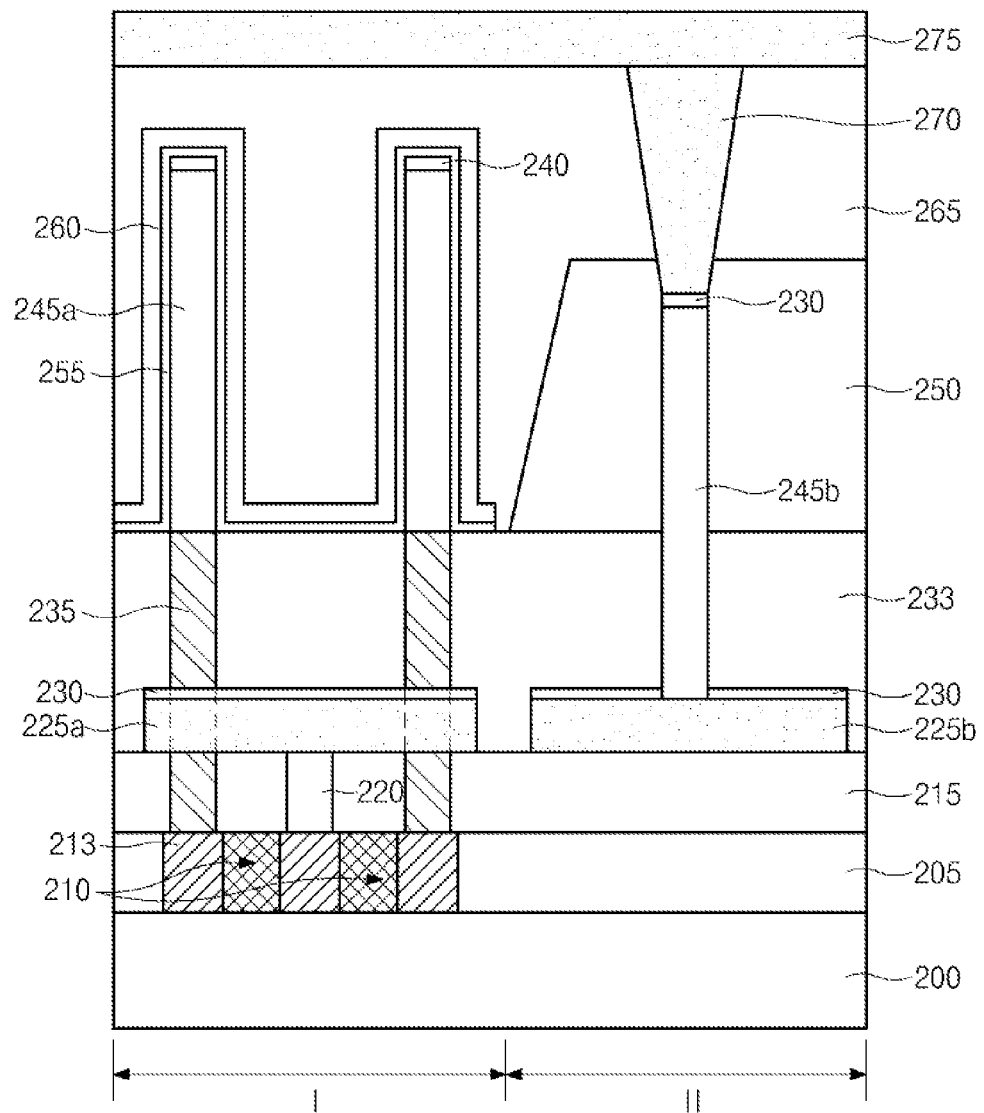
FIG. 2 illustrates a semiconductor device according to the present invention.

FIG. 2 illustrates a semiconductor device according to the present invention. Now, referring to FIG. 2, a semiconductor device of the present invention is described. The semiconductor device is mainly illustrated in the cell region I.

First, a gate electrode 210 and a landing plug 213 are formed over a substrate 200. Then, a bit line contact 220 connected to the landing plug 213 is formed, and a bit line 225a connected to the bit line contact 220 is formed. A bit line pad 225b is formed in the peripheral region II. Then, a storage node contact 235 connected to the landing plug 213 is formed. Also, a lower electrode 245a connected to the storage node contact 235 is formed. A first contact 245b connected to the bit line pad 225b is formed in the peripheral region II. The lower electrode 245a and the first contact 245b are a nano tube structure.

Also, a dielectric film 255 and an upper electrode 260 are further formed over the lower electrode 245a. A second contact 270 connected to the first contact 245b is further formed over the first contact 245b. The second contact 270 then connects to the metal wiring layer 275.

The present invention is widely applicable to a semiconductor device having a DRAM, embedded memory device, or other metal oxide film transistors, which need an existing capacitor.

In accordance with the present invention, a method for fabricating a semiconductor device secures capacitance of a lower electrode without an etching process for a high aspect ratio since a nano structure is vertically grown to form the lower electrode.

Also, in the peripheral region, an etching process is not performed for a high aspect ratio when a height of a lower electrode or a height between a bit line and a metal wiring layer is high, and a nano structure is vertically grown to form a contact plug, thereby easily corresponding to a height of the high lower electrode.

Also, the lower electrode in a cell region and the contact plugs in the peripheral region are simultaneously formed to simplify a manufacturing process.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A method of fabricating a semiconductor device, the method comprising:
    forming a bit line and a bit line pad in a cell region and a peripheral region, respectively, over a substrate;
    forming a first metal layer on the bit line and the bit line pad;
    forming an interlayer insulating film over the first metal layer and the substrate;
    etching the interlayer insulating film in the cell region to form a storage node contact hole;
    filling the storage node contact hole with conductive material to form a storage node contact plug in the cell region;
    forming a second metal layer over the storage node contact plug;
    etching the interlayer insulating film in the peripheral region to form a contact hole exposing the first metal layer over the bit line pad;
    growing a nano tube using the second metal layer in the cell region and the exposed first metal layer in the peripheral region as a catalyst to form a lower electrode and a first contact, respectively; and
    forming a second contact connected to the first contact in the peripheral region to form a via contact.

2. The method of claim 1, further comprising:
    forming a dielectric film over a surface of the interlayer insulating film and the lower electrode; and
    forming an upper electrode over a surface of the dielectric film,
    wherein the lower electrode, the dielectric film, and the upper electrode define a capacitor.

3. The method of claim 1, wherein the first metal layer and the second metal layer includes one selected from the group consisting of Ni, Co, Fe, La, Ti, Y, Pd, Pt and combinations thereof.

4. The method of claim 1, wherein the uppermost surface of the storage node contact plug is lower than the upper most surface of the interlayer insulating film to provide a height difference between the storage node contact plug and the interlayer insulating film.

5. The method of claim 4, wherein the forming the second metal layer comprises:
    forming a metal catalyst material over the storage node contact plug and the interlayer insulating film; and
    polishing the metal catalyst material until the interlayer insulating film is exposed, where the metal catalyst material and the interlayer insulating film define a planar surface without a substantial height difference.

6. The method of claim 1, wherein the nano tube is grown using a chemical vapor deposition (CVD) process.

7. The method of claim 1, wherein the nano tube is a carbon nano tube, a Si nano tube or a Ge nano tube.

8. The method of claim 7, wherein the carbon nano tube is grown by using $CH_4$, $C_2H_2$, ethanol or CO gas at a temperature of 300~900° C.

9. The method of claim 7, wherein the Si nano tube is grown by using a gas containing $SiH_4$ or $Si_2H_6$ at a temperature of 300~900° C.

10. The method of claim 7, wherein the Ge nano tube is grown by using Ge containing gas at a temperature of 300~900° C.

11. The method of claim 1, further comprising forming a dielectric film and an upper electrode over the lower electrode and the interlayer insulating film.

12. The method of claim 1, further comprising forming a metal wiring connected to the second contact,
wherein the conductive material partly fills the storage node contact hole to provide a height difference between the interlayer insulating layer and the storage node contact plug.

13. A semiconductor device, comprising:
a bit line and a storage node contact plug formed in a cell region;
a bit line pad formed in a peripheral region;
a lower electrode of a capacitor coupled to the storage node contact plug, the lower electrode including a first nano tube; and
a first contact coupled to the bit line pad, the first contact including a second nano tube.

14. The semiconductor device of claim 13, wherein the first nano tube is a carbon nano tube, a Si nano tube or a Ge nano tube.

15. The semiconductor device of claim 13, wherein the second nano tube is a carbon nano tube, a Si nano tube or a Ge nano tube, and
wherein the first and second nano tubes comprise substantially the same material.

16. The semiconductor device of claim 13, further comprising a second contact directly contacting the first contact.

* * * * *